(12) United States Patent
Chen

(10) Patent No.: US 10,738,984 B2
(45) Date of Patent: Aug. 11, 2020

(54) LIGHT-EMITTING DEVICE FOR LAMP

(71) Applicant: DONGGUAN CITY MINLEON ELECTRONICS CO., LTD., Guangdong (CN)

(72) Inventor: Dongchang Chen, Guangdong (CN)

(73) Assignee: DONGGUAN CITY MINLEON ELECTRONICS CO., LTD., Guangdong (CN)

( * ) Notice: Subject to any disclaimer, the term of this patent is extended or adjusted under 35 U.S.C. 154(b) by 0 days.

(21) Appl. No.: 16/243,094

(22) Filed: Jan. 9, 2019

(65) Prior Publication Data

US 2020/0124261 A1 Apr. 23, 2020

(30) Foreign Application Priority Data

Oct. 19, 2018 (CN) ..................... 2018 2 1704283 U

(51) Int. Cl.
| | |
|---|---|
| *F21V 23/00* | (2015.01) |
| *F21V 23/06* | (2006.01) |
| *H05K 1/11* | (2006.01) |
| *H01L 33/20* | (2010.01) |
| *H05K 1/18* | (2006.01) |
| *H01L 33/62* | (2010.01) |
| *F21Y 115/10* | (2016.01) |

(52) U.S. Cl.
CPC ............ *F21V 23/005* (2013.01); *F21V 23/06* (2013.01); *H01L 33/20* (2013.01); *H01L 33/62* (2013.01); *H05K 1/111* (2013.01); *H05K 1/181* (2013.01); *F21Y 2115/10* (2016.08); *H05K 2201/10106* (2013.01); *H05K 2201/10636* (2013.01)

(58) Field of Classification Search
None
See application file for complete search history.

(56) References Cited

U.S. PATENT DOCUMENTS

2009/0129087 A1 * 5/2009 Starkey ..................... F21K 9/00
362/249.02

* cited by examiner

*Primary Examiner* — Elmito Breval
(74) *Attorney, Agent, or Firm* — JCIPRNET

(57) ABSTRACT

The disclosure is related to a light-emitting device for lamp, including a circuit board and a patch LED lamp. The circuit board is provided with an LED driving chip and a plurality of resistor elements. The circuit board is provided with a pad corresponding to the patch LED lamp. The patch LED lamp includes a light-emitting substrate and two connecting legs connecting the light-emitting substrate. The connecting legs are formed in L shape and are respectively connected to two opposite sides of the light-emitting substrate. The connecting legs of the patch LED lamp are soldered on the pad, and an angle between the light-emitting surface of the patch LED lamp and the pad is 90°.

3 Claims, 3 Drawing Sheets

LIGHT-EMITTING DEVICE FOR LAMP

CROSS-REFERENCE TO RELATED APPLICATION

This application claims the priority benefit of China application serial no. 201821704283.8, filed on Oct. 19, 2018. The entirety of the above-mentioned patent application is hereby incorporated by reference herein and made a part of this specification.

BACKGROUND OF THE DISCLOSURE

Field of the Disclosure

The disclosure relates to the technical field of lamp accessories, in particular to a light-emitting device for a lamp.

Description of Related Art

With the deteriorating natural environment and the scarcity of energy, green energy is increasingly favored by people. Therefore, more and more lamp manufacturers use LED lamps as the light source for the production and manufacture of lamps.

However, conventional LED lamps generally use two circuit boards to manufacture light-emitting components. One of the circuit boards is used to place an LED lamp, and the other circuit board is used to manufacture the driving circuit for the LED lamp, and then the two circuit boards are connected by soldering, thereby realizing the structure of the light-emitting device of the lamp. However, such manufacturing method of the LED lamp increases labor costs and reduces production efficiency.

SUMMARY OF THE DISCLOSURE

In view of foregoing, there is a need for a light-emitting device for lamp capable of improving production efficiency to solve the technical problem that the existing light-emitting device has low production efficiency.

In order to achieve the above purpose, the present disclosure adopts the following technical solutions.

A light-emitting device for lamp, including a circuit board and a patch LED lamp, wherein the circuit board is provided with an LED driving chip and a plurality of resistor elements, wherein the circuit board is provided with a pad corresponding to the patch LED lamp. The patch LED lamp includes a light-emitting substrate and two connecting legs connecting the light-emitting substrate, wherein the connecting legs are disposed in an L shape and are respectively connected to two opposite sides of the light-emitting substrate. The connecting legs of the patch LED lamp are soldered to the pad; the angle between the light-emitting surface of the patch LED lamp and the pad is 90°.

The light-emitting device for lamp of the disclosure is configured with a pad corresponding to the patch LED lamp on the circuit board, and then the patch LED lamp is directly mounted on the pad, and the angle between the light-emitting surface of the patch LED lamp and the pad is 90°, such that light-emitting operation can be realized without using two circuit boards, not only that PCB board and labor can be saved but also production efficiency can be increased.

In one of the embodiments, each of the connecting leg includes a first connecting segment and a second connecting segment, the first connecting segment is connected to the second connecting segment to form an L-shaped arrangement.

In one of the embodiments, the light-emitting substrate is provided with two grooves corresponding to the connecting legs, and the grooves are disposed in an L shape.

In one of the embodiments, the number of the patch LED lamps is single or multiple.

DESCRIPTION OF REFERENCE SIGNS

100. A light-emitting device for lamp;
10. circuit board, 11. LED driving chip, 12. resistor element, 13. pin;
20. patch LED lamp, 21. light-emitting surface, 22. light-emitting substrate, 23. connecting leg, 24. first connecting segment, 25. second connecting segment, 26. groove.

DESCRIPTION OF EMBODIMENTS

In order to facilitate the understanding of the present disclosure, the present disclosure will be more fully described below. However, the disclosure may be implemented in many different forms and is not limited to the embodiments described herein. Rather, these embodiments are provided to provide a more comprehensive understanding of the content of the disclosure.

It should be noted that when an element is referred to as being "fixed" to another element, it may be directly disposed on another element or disposed therein. When an element is considered to be "connected" to another element, it may be directly connected to another element or disposed therein.

Unless otherwise defined, all the technical and scientific terms used herein have the same meaning as commonly understood by persons of ordinary skill in the art of the disclosure. The terminologies used in the description of the present disclosure are for the purpose of describing particular embodiments and are not intended to limit the disclosure.

Figure 1:
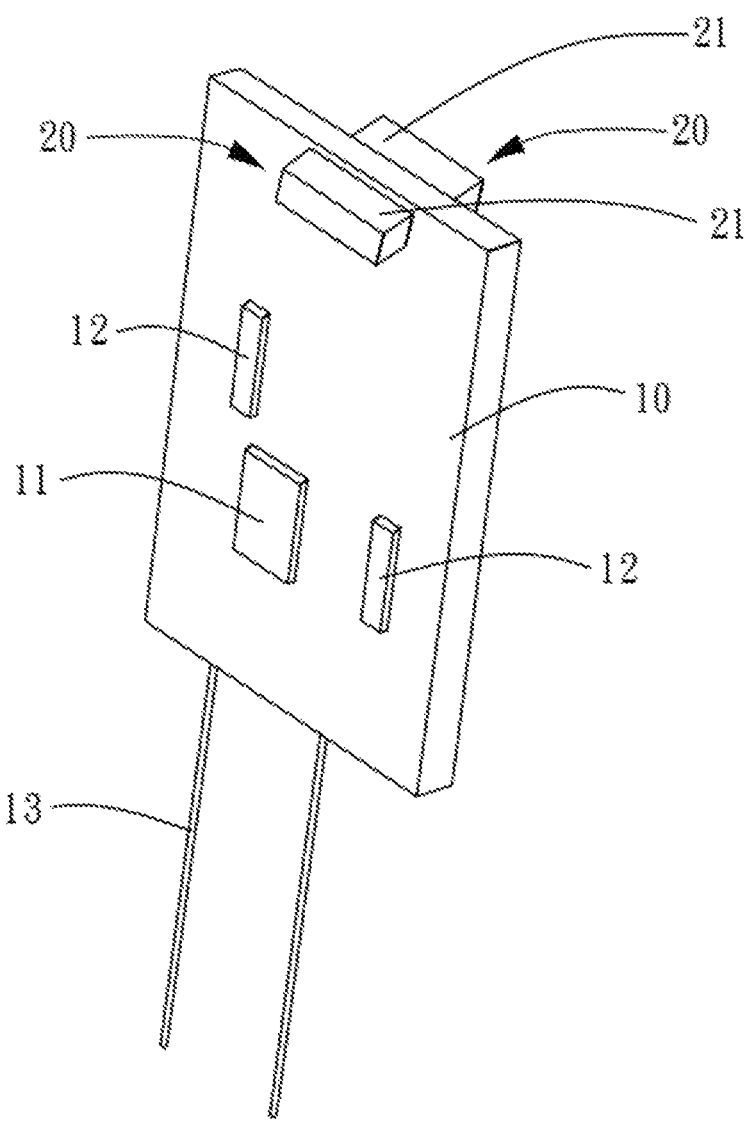
FIG. 1 is a schematic view of a light-emitting device for lamp according to an embodiment of the present disclosure.
Figure 2:
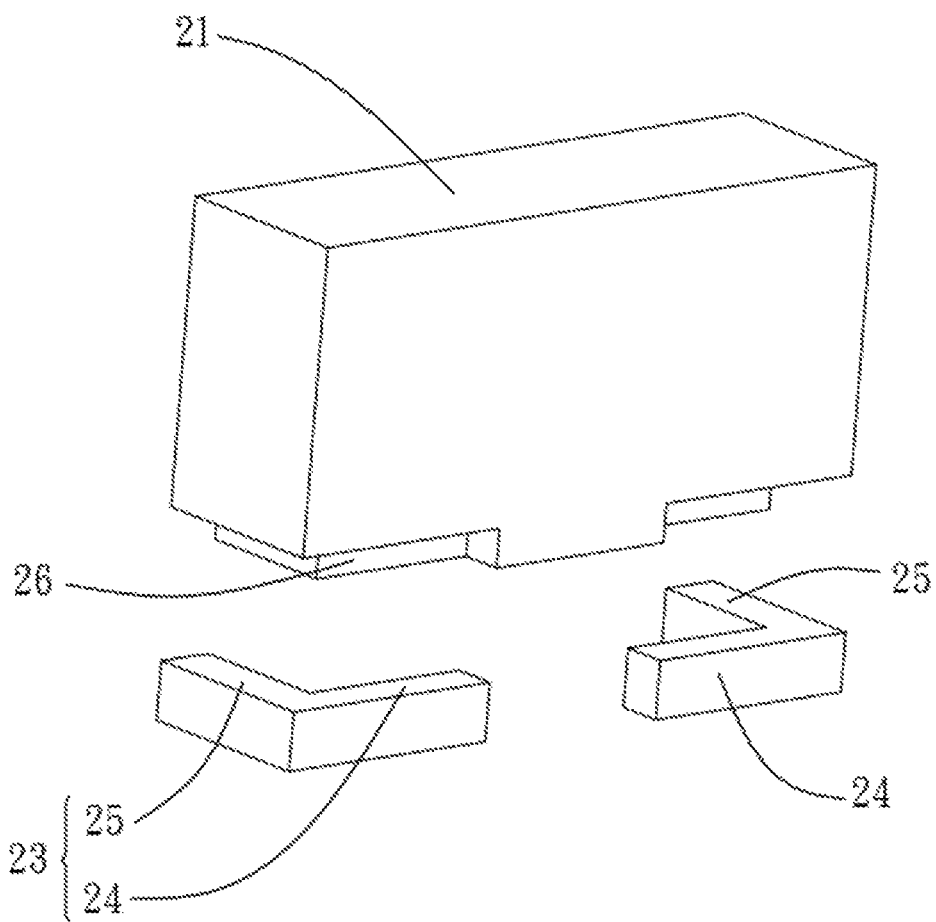
FIG. 2 is a schematic view of a light-emitting substrate of FIG. 1.
Figure 3:
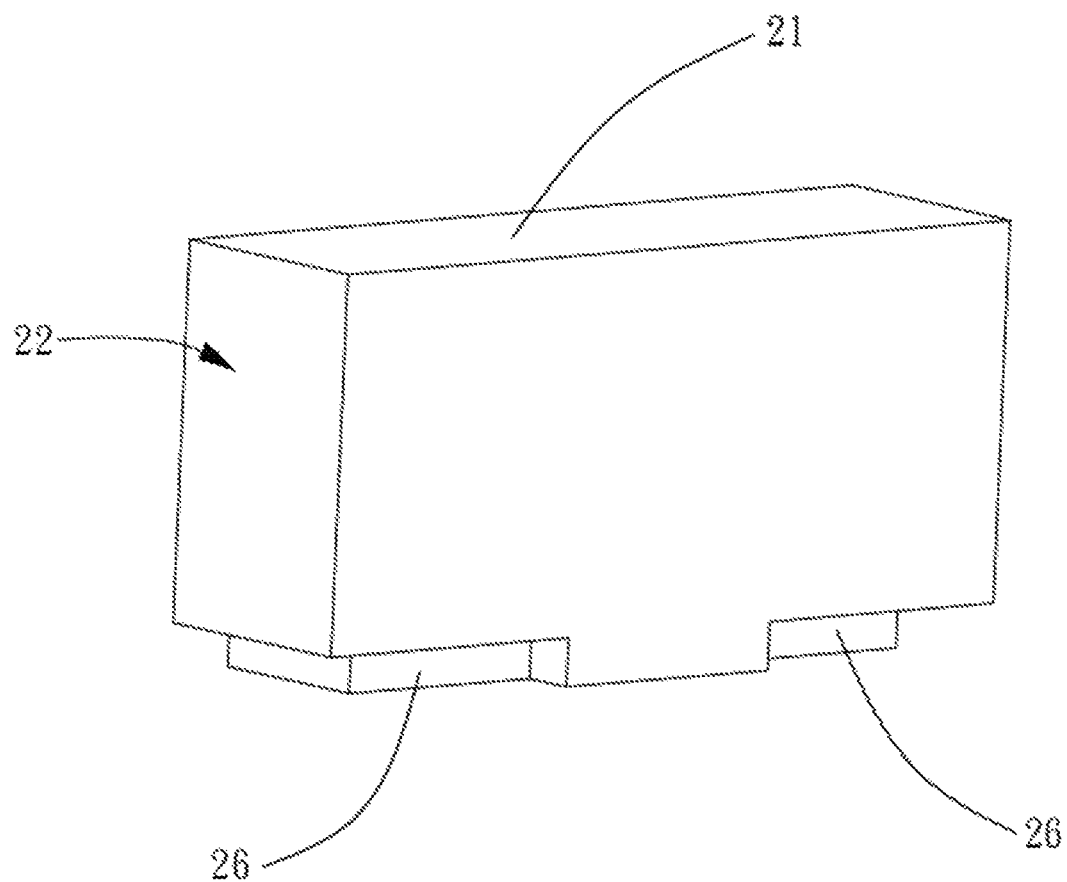
FIG. 3 is a schematic exploded view of a patch LED lamp of FIG. 1.

Referring to FIG. 1 to FIG. 3, a light-emitting device 100 for lamp according to an embodiment of the present disclosure includes a circuit board 10 and a patch LED lamp 20, and the patch LED lamp 20 is mounted on the circuit board 10. The circuit board 10 is provided with an LED driving chip 11 and a plurality of resistor elements 12, and the lower end of the circuit board 10 is further provided with two pins 13; the circuit board 10 is further provided with a pad corresponding to the patch LED lamp 20. The patch LED lamp 20 is connected to the pad by soldering, and the light-emitting surface 21 of the patch LED lamp 20 is perpendicular to the pad, that is, the angle between the light-emitting surface 21 of the patch LED lamp 20 and the pad is 90°. The light-emitting device 100 for lamp is configured by directly mounting the patch LED lamp 20 on the circuit board 10, so that conduction and connection can be realized through additional processing, thereby saving the PCB board while saving labor and increasing production efficiency.

It should be noted that the LED driving chip 11 is a common LED control IC chip, which is common technology and is not described in detail herein. In the present embodiment, the number of the patch LED lamp 20 is two and are respectively mounted on both sides of the circuit board 10. It may be understood that in other embodiments, the number of the patch LED lamp 20 may be single or multiple and may be adjusted correspondingly depending on actual production needs.

Further, the patch LED lamp 20 is mounted at the edge of the circuit board 10, and the light-emitting surface 21 of the patch LED lamp 20 is emitted outward. The patch LED lamp 20 includes a light-emitting substrate 22 and two connecting legs 23 connecting the light-emitting substrate 22, and the connecting legs 23 are soldered to the pads. Meanwhile, the connecting legs 23 are disposed in an L shape; further, the connecting legs 23 include a first connecting segment 24 and a second connecting segment 25, which are connected to each other to form an L-shaped arrangement. The connecting legs 23 are respectively connected to two opposite sides of the light-emitting substrate 22, and the first connecting segment 24 is soldered on the pads. The L-shaped structure of the connecting legs 23 allows the patch LED lamp 20 to be more firmly secured on the circuit board so it is not easily shifted or loosen. On the other hand, the light-emitting substrate 22 is provided with two grooves 26 corresponding to the connecting legs 23, and the grooves 26 are disposed in an L shape for placing the connecting legs 23, thereby reducing the volume of the patch LED lamp 20, and it is possible to achieve a more reasonable structure of the patch LED lamp 20.

The light-emitting device for lamp of the disclosure is configured with a pad corresponding to the patch LED lamp on the circuit board, and then the patch LED lamp is directly mounted on the pad, and the angle between the light-emitting surface of the patch LED lamp and the pad is 90°, such that light-emitting operation can be realized without using two circuit boards, not only that PCB board and labor can be saved but also production efficiency can be increased.

The technical features of the above-described embodiments may be combined in any ways. For the sake of brevity of description, not all of the possible combinations of the technical features in the above embodiments are not described. However, as long as there is no contradiction between the combinations of these technical features, they should be considered as falling within the scope of this disclosure.

The above-mentioned embodiments are merely illustrative of several embodiments of the present disclosure, and the description thereof is more specific and explicit, but should not to be construed as a limitation to the scope of the disclosure. It should be noted that a number of variations and modifications may be made by those skilled in the art without departing from the spirit and scope of the disclosure, and they should belong to the scope sought to be protected by the disclosure. Therefore, the scope of the disclosure should be defined by the appended claims.

What is claimed is:

1. A light-emitting device for lamp, comprising: a circuit board and a patch LED lamp, wherein the circuit board is provided with an LED driving chip and a plurality of resistor elements, wherein the circuit board is provided with a pad corresponding to the patch LED lamp; the patch LED lamp comprises a light-emitting substrate and two connecting legs connecting the light-emitting substrate, the connecting legs are disposed in an L shape and respectively connected to two opposite sides of the light-emitting substrate; the connecting legs are soldered on the pad; an angle between a light-emitting surface of the patch LED lamp and the pad is 90°.

2. The lighting-emitting device for lamp according to claim 1, wherein each of the connecting legs comprises a first connecting segment and a second connecting segment, and the first connecting segment is connected to the second connecting segment to form an L shaped arrangement, and the first connecting segment is soldered on the pad.

3. The lighting-emitting device for lamp according to claim 1, wherein the light-emitting substrate is provided with two grooves corresponding to the connecting legs, and the grooves are arranged in an L shape.

* * * * *